United States Patent [19]

Munier

[11] Patent Number: 4,609,943
[45] Date of Patent: Sep. 2, 1986

[54] DEVICE PHOTOSENSITIVE TO INFRA-RED RADIATION

[75] Inventor: Bernard Munier, Seyssinet Pariset, France

[73] Assignee: Thomson-CSF, Paris, France

[21] Appl. No.: 673,423

[22] Filed: Nov. 20, 1984

[30] Foreign Application Priority Data

Nov. 25, 1983 [FR] France .................. 83 18845

[51] Int. Cl.[4] ............................................. H04N 3/14
[52] U.S. Cl. ......................................... 358/213; 357/24
[58] Field of Search .............................. 358/213, 212; 357/24 LR

[56] References Cited

U.S. PATENT DOCUMENTS 4,115,692 9/1978 Balcerak et al. ............ 357/24 LR
4,430,672 2/1984 Berger .......................... 358/213

FOREIGN PATENT DOCUMENTS 0038725 10/1981 European Pat. Off. ........... 358/213

OTHER PUBLICATIONS

IEEE Transactions on Electron Devices, vol. ED-27, No. 1, Jan. 1980, New York (US), P. Felix et al.: "CCD Readout of Infrared Hybrid . . . ".
Electrons Letters, vol. 18, No. 7, Apr. 1982, Londres (GB), R. A. Ballingall et al.: "Electronically Scanned CMT Detector Array for the . . . ".

Primary Examiner—Gene Z. Rubinson
Assistant Examiner—Stephen Brinich
Attorney, Agent, or Firm—Roland Plottel

[57] ABSTRACT

In a device photosensitive to infra-red radiation each infra-red detector is associated with means enabling the injection into a semiconductor substrate of a quantity of charges representing a function of the infra-red radiation received by the detector, and with means assuring the storage of these charges. The storage means of the detectors of one and the same line are joined via connections to charge reading means, common to the detectors of one and the same line, and which assure the column after column reading of the detectors by reason of a shift register which successively addresses the storage means of the detectors of one and the same column. The device as a whole may be integrated within a cryostat having a single high-level output.

13 Claims, 18 Drawing Figures

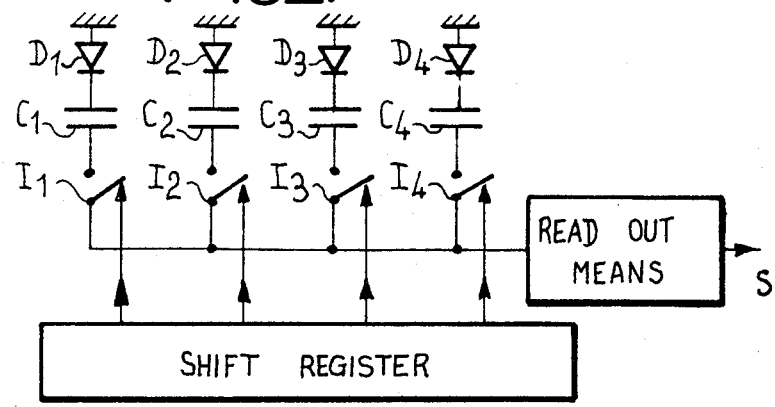
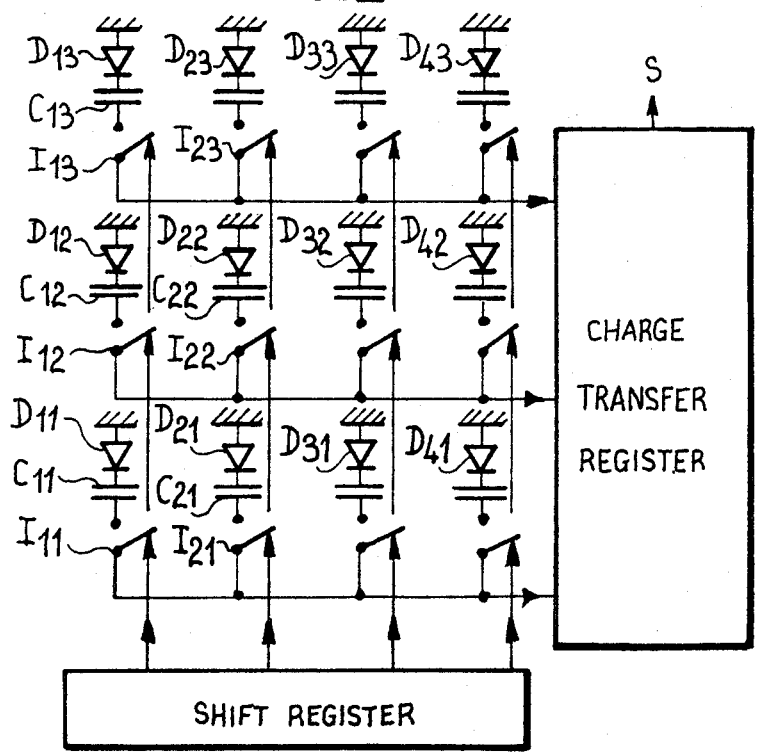

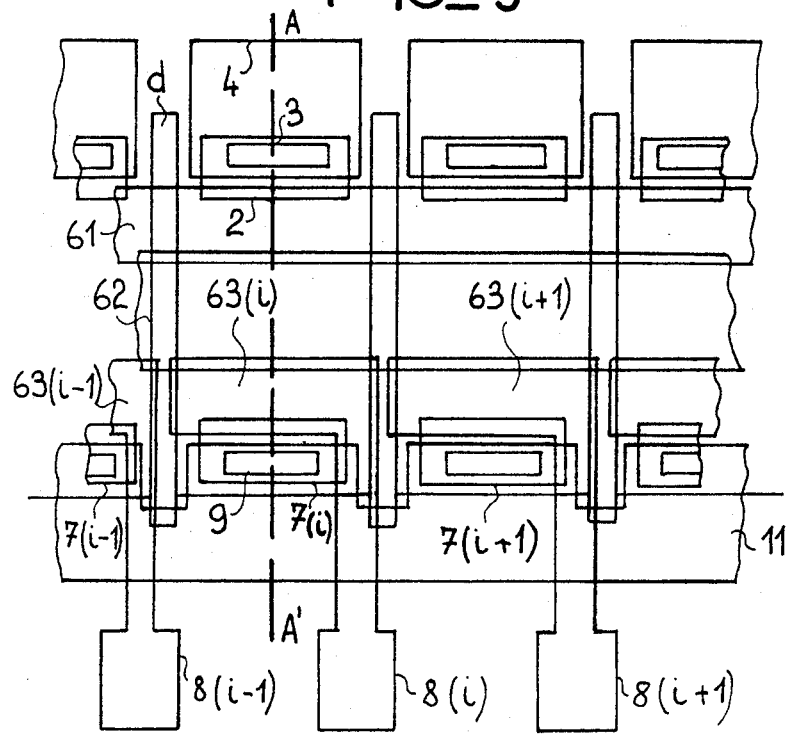
FIG_3
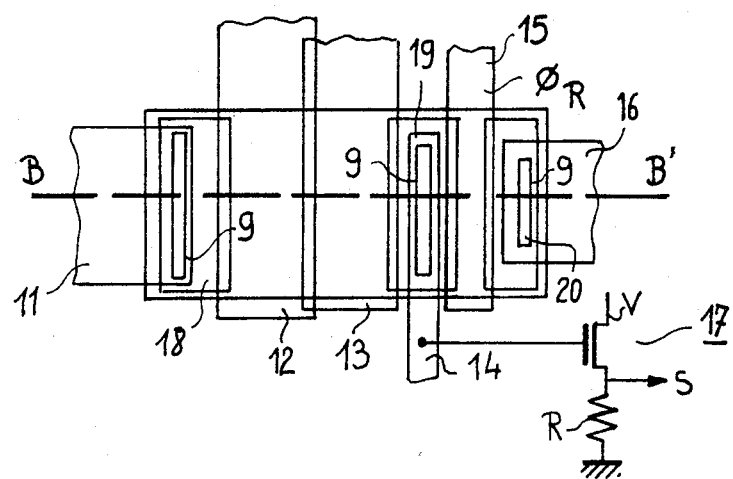
FIG_4

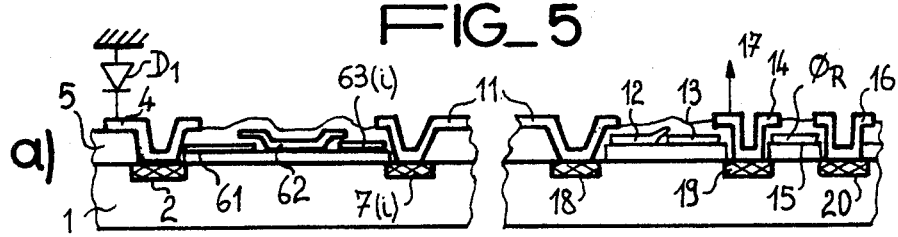
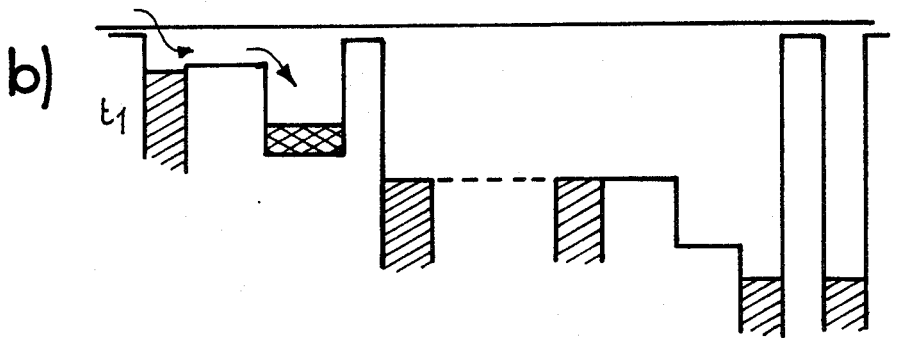
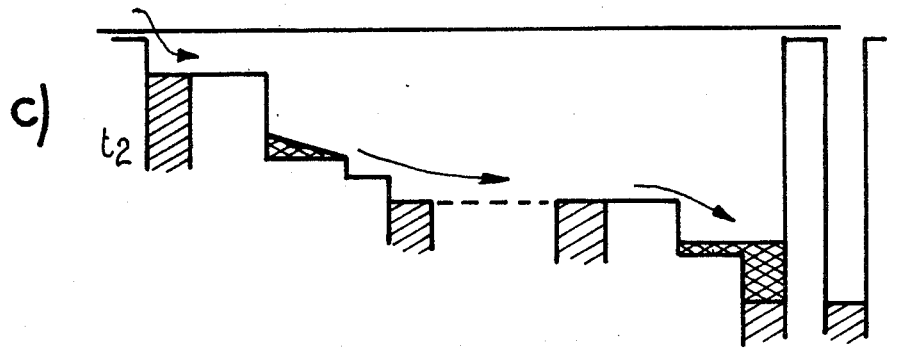
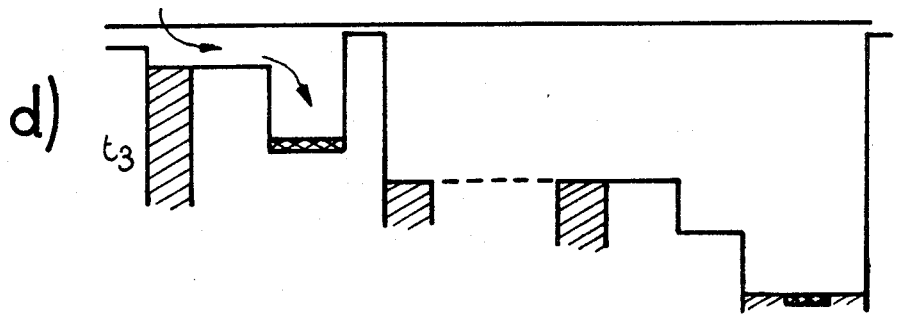
Fig. 5

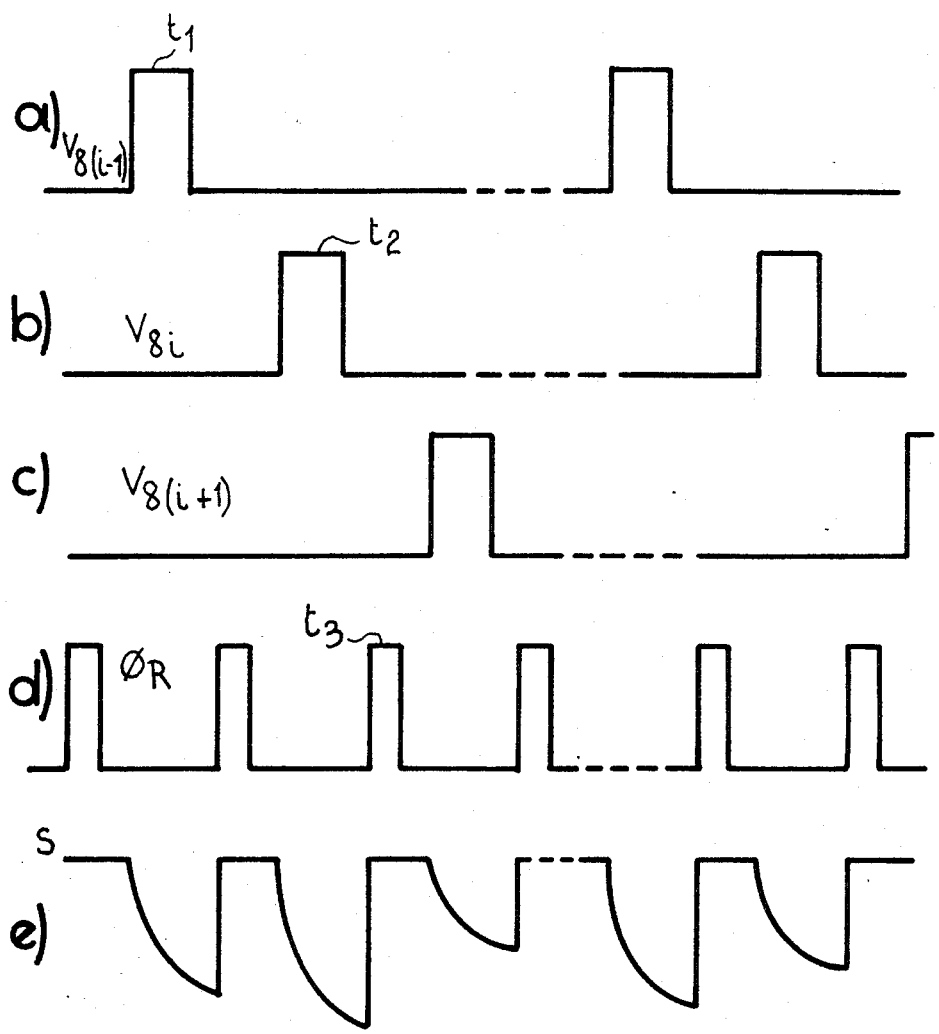

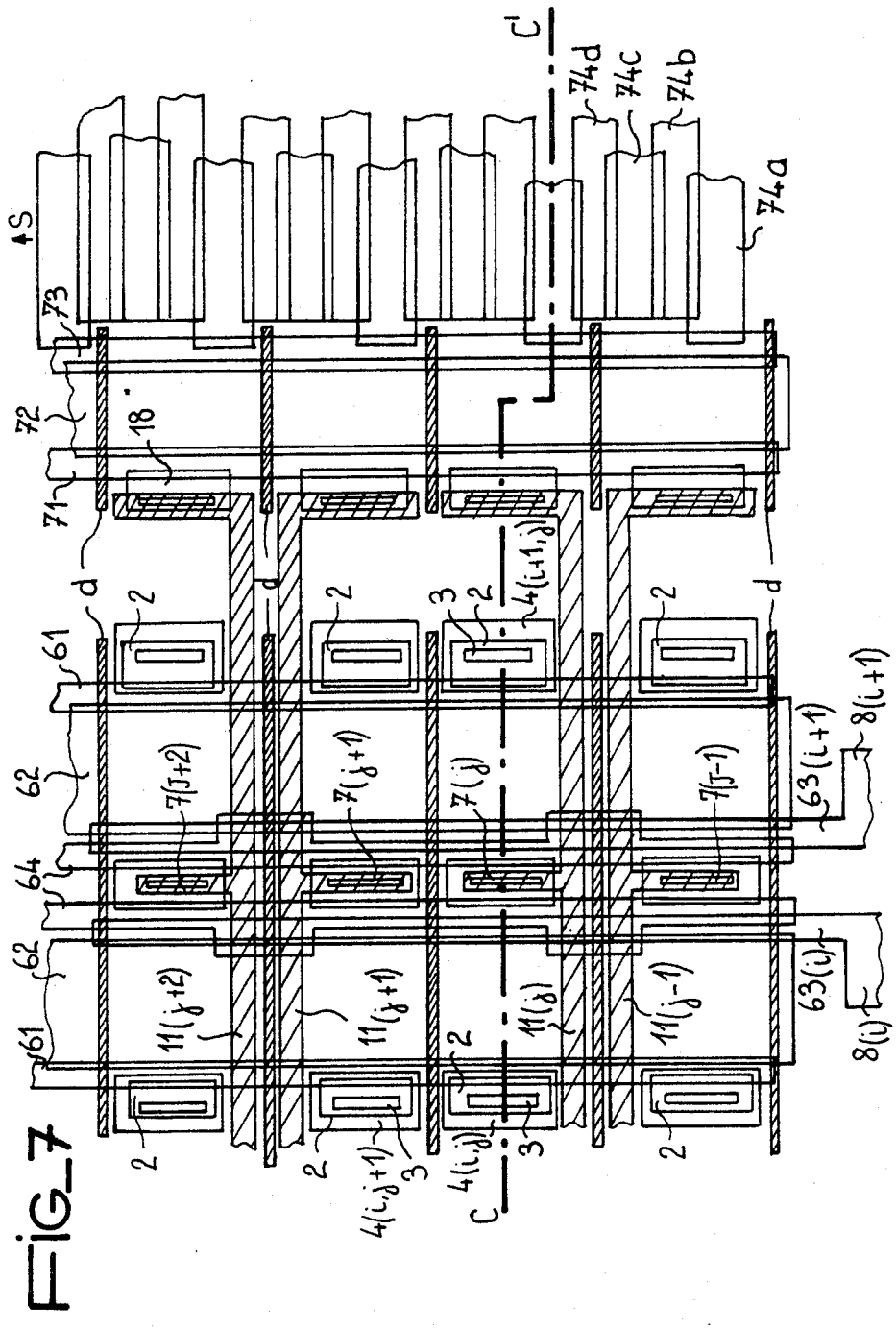

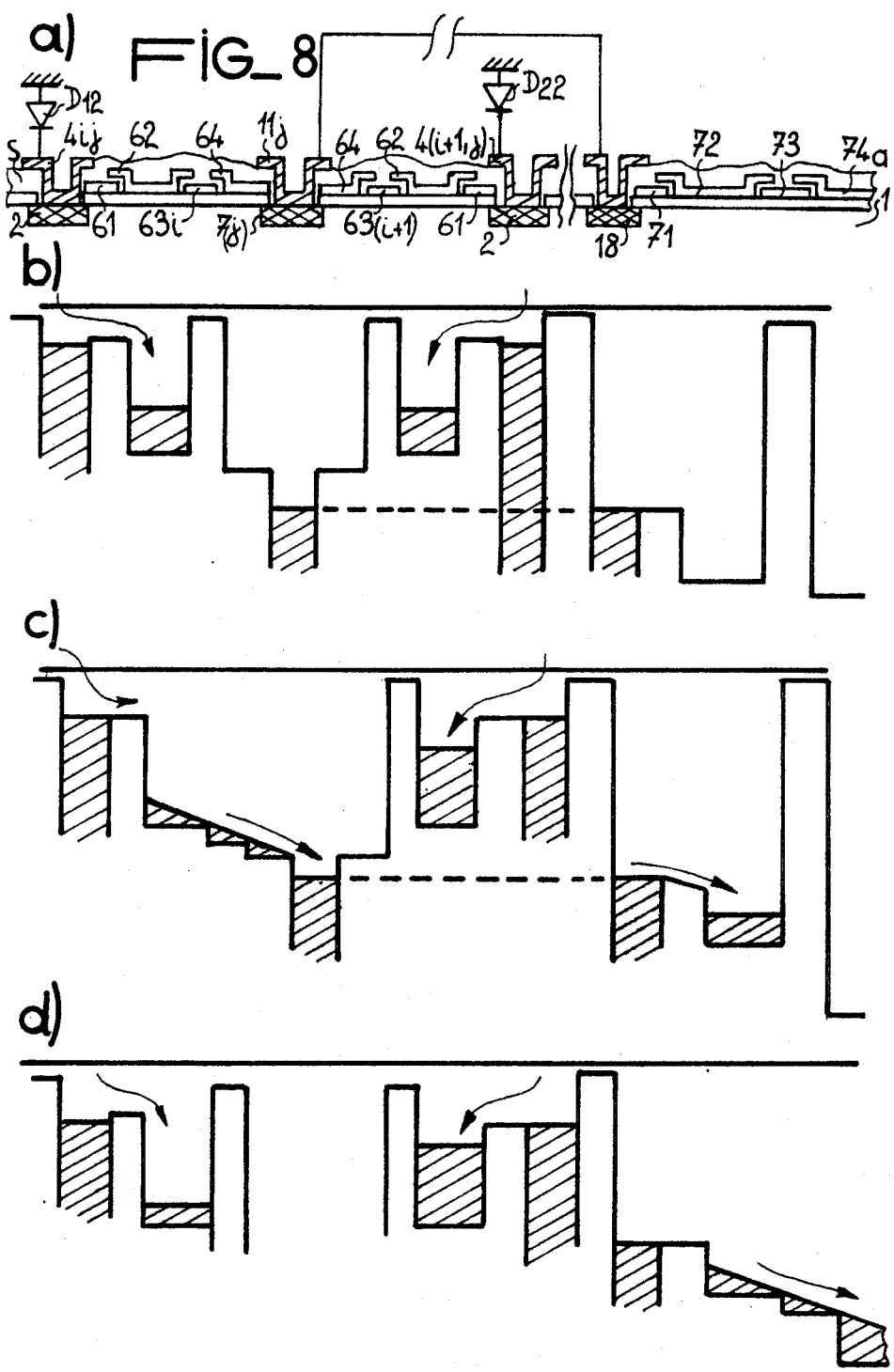

DEVICE PHOTOSENSITIVE TO INFRA-RED RADIATION

BACKGROUND OF THE INVENTION

1. Field of the Invention

The present invention relates to a device photosensitive to infra-red radiation.

This device may comprise a two-dimensional mosaic of detectors, distributed in M lines and N columns, or it may comprise a bar or single line of N detectors.

2. Prior Art

A variety of devices which are photosensitive to the infra-red range are known in the prior art.

The operation of three of these devices will be recalled briefly in the following.

A device in which each detector is associated with an MOS transistor became known from the article entitled "Electronically scanned CMT detector array for the 8-14 μm band" which appeared in the periodical "Electronics Letters" of Apr. 1, 1982, volume 18, number 7, pages 285 to 287. A shift register enables each line of detectors to be addressed successively via MOS transistors. The charges derived from the detectors of the line addressed are stored by means of a series of operational amplifiers arranged as integrators, each amplifier being connected via MOS transistors to the detectors of one and the same column. A multiplexer enables sequential reading of the integrators, whereupon another line of detectors is addressed by the register.

It should be observed that, in a device of this kind, the integration of the charges is performed successively for each line of detectors by the same amplifiers arranged as integrators. The period of integration of the charges originating from each detector is therefore greatly limited. Another disadvantage of a device of this kind is that the operational amplifiers cannot be positioned in the cryostat enclosing the detectors and the remainder of the device. This cryostat consequently comprises numerous low-level outputs.

A device of another type is known from the article entitled "CCD readout of infrared hybrid focalplane arrays", published in the periodical "I.E.E.E. Transactions on Electron Devices", volume ED27, number 1, January 1980, pages 175 to 188. In this device—see FIG. 2 of the article quoted—each detector is associated with a capacity for storage of the charges which is connected to one of the inputs of a charge transfer register.

In a device of this type, all the lines of detectors are addressed simultaneously so that the contents of the storage capacities may be transferred into the shift registers having their inputs in parallel and their outputs in series. The outputs of these registers are connected to the inputs of another charge transfer shift register of the series output type, which delivers the output signal of the device. In a device of this nature, the period of integration of the charges may be substantial and the device as a whole may be contained within a cryostat. The disadvantage of a device of this kind is, in particular, that a loss of information occurs because of the inefficiency of transfer of the charge transfer registers. This inefficiency is increased by the very low temperature, 77K for example of the cryostat and by the great number of transfers to be performed, for example 400 transfers for 100 detectors. Another disadvantage of a device of this type is its bulk.

For each detector, the charges must be stored in a storage capacity during the integration period, and then in a shift register during the readout period. Two storage surfaces are thus needed for each detector.

Finally, this review of different kinds of devices which are photosensitive to infra-red radiation, will be completed by the devices in which the integration of the charges is performed in the detectors operating in the so-called "VIDICON" mode. An operation of this nature yields poor performances in the case of infra-red detectors, in particular of those which are sensitive in the 8-12 μm band.

SUMMARY OF THE INVENTION

The present invention has as its object a new kind of device photosensitive to infra-red radiation which, like that described in the quoted I.E.E.E. article, comprises a storage capacity per detector. In some of its embodiments, this device may be placed within a cryostat having but one high-level output. As compared to the device according to the I.E.E.E. article, the device in accordance with the invention permits, for the same size, an integration period which is 3 to 5 times longer. As a matter of fact, the contents of the storage capacities may be increased in the device in accordance with the invention, since the remainder of the device is of smaller bulk.

In particular, charge storage means are allocated to each detector, but the readout means are common to the detectors of one and the same line.

The present invention provides a device photosensitive to infra-red radiation, comprising at least one line of several infra-red detectors integrated on a first semiconductor substrate, placed within a cryostat, each detector being connected to means enabling injection into a second semiconductor substrate, placed within the cryostat, of a quantity of charges representing a function of the infra-red radiation received by each detector, this device comprising means associated with each detector assuring the storage of the charges in the second substrate and comprising charge readout means, characterised in that the storage means of the detectors of one and the same line are joined via a connection to the readout means common to these detectors and which assure sequential readout of the detectors of one and the same line by means of a shift register successively addressing the storage means of each detector of one and the same line.

BRIEF DESCRIPTION OF THE DRAWINGS

Other objects and features of the invention will appear from the following description given by way of example with reference to the accompanying drawings, in which:

FIGS. 1 and 2 illustrate diagrams of two embodiments of the device in accordance with the invention, FIGS. 3 and 4 illustrate views from above of the charge injection, storage and readout means for an embodiment of the device in accordance with the invention, in the case of a bar of detectors, FIGS. 5a, b, c and d illustrate a view in cross-section along the lines AA' and BB' of FIGS. 3 and 4, and diagrams describing the operation of the device, FIGS. 6a, b, c, d and e illustrate control signals and the output signal of the device of FIGS. 3 and 4, FIG. 7 illustrates a view from above of an embodiment of a device in accordance with the invention, in the case of a mosaic of detectors; and FIGS. 8a, b, c and d illustrate a view in cross-section along the line CC' of FIG. 7 and diagrams describing the operation of the device.

In the different figures, identical symbols denote identical elements, but the dimensions and proportions of the different parts have not been adhered to, for the sake of clear illustration.

DESCRIPTION OF THE PREFERRED EMBODIMENTS

FIG. 1 illustrates the diagram of one embodiment of a device photosensitive to infra-red radiation, in accordance with the invention.

It comprises a bar of N photodiodes, with N equal to 4 in the figure, having the anodes connected to ground and which are integrated on a first semiconductor substrate situated within a cryostat.

Each photodiode $D_1$, $D_2$, $D_3$ and $D_4$ is connected via its cathode to means enabling injection of a quantity of charges, depending on the infra-red radiation received by each detector, into a second semiconductor substrate, for example of silicon, which is situated within the cryostat. This device comprises means associated with each detector assuring the storage of the charges in the second semiconductor substrate.

The means of injecting and storing charges have been illustrated symbolically in FIG. 1 by a capacitance $C_1$, $C_2$, $C_3$, $C_4$ connected to the cathode of each photodiode $D_1$, $D_2$, $D_3$, $D_4$.

Each of the capacitances is connected via a switch $I_1$, $I_2$, $I_3$, $I_4$ to readout means common to all the detectors and which provide the output signal S of the device. The switches $I_1$, $I_2$, $I_3$, $I_4$ are controlled by the outputs of a shift register. No more than one switch is closed at a time, for example $I_1$ is closed, then $I_2$, then $I_3$... which assures the sequential readout of the detectors $D_1$, $D_2$, $D_3$, $D_4$. It is sufficient to this end to transfer a signal assuring the closing of the switches from one output of the register to the other.

FIG. 2 illustrates the layout of an embodiment of a device in accordance with the invention. The device differs from that of FIG. 1, since it comprises a two-dimensional mosaic of M lines and N columns of photodiodes, with M=3 and N=4 in FIG. 2.

Each output of the shift register simultaneously addresses the switches allocated to the detectors of one and the same column. One output of the register thus simultaneously addresses the switches $I_{11}$, $I_{12}$, $I_{13}$ allocated to the detectors $D_{11}$, $D_{12}$, $D_{13}$, the following output addresses the switches $I_{21}$, $I_{22}$, $I_{23}$ allocated to the detectors $D_{21}$, $D_{22}$, $D_{23}$... and so on in sequence.

Each detector is connected to storage and injection means—denoted by a capacitance—and to a switch. The switches allocated to the detectors of one and the same line are coupled via one and the same connection to an input of a charge transfer shift register of the kind having parallel inputs and series output S. The shift register having parallel outputs successively addresses each column of detectors and the charges contained in the storage means are transferred simultaneously in parallel into the charge transfer register and then transferred in series to the output S of this register, which has associated with it a charge readout device. When the transfer of the charges originating from a column of detectors into the charge transfer register is completed, the integration of the charges recommences for this column of detectors.

In accordance with the embodiments of the readout means connected to each line of detectors, the whole of the device according to the invention may or may not be contained in one and the same cryostat, as will become apparent from the following description.

FIGS. 3, 4 and 5 relate to an embodiment of a device in accordance with the invention in the case of a bar of detectors, FIGS. 3 and 4 being views from above of particular parts of this device.

FIG. 5a is a view in cross-section of this device, and FIGS. 5b, c and d illustrate diagrams describing its operation.

The detectors in FIG. 5a, such as the photodiode $D_1$, are connected via a metal contact 4 to an input diode 2 by way of an opening 3 formed in the layer 5 of insulating material which covers the semiconductor substrate 1, for example of P type silicon. A first grid 61 deposited on the insulating layer 5 controls the surface potential of the input channel. In the example illustrated in FIG. 3, this grid is horizontal and controls the input channel allocated to each detector of the said bar. This grid 61 is kept at a constant potential. A second grid 62 is utilised for storing the charges coming from the detectors. In FIG. 3, the grid 62 is equally common to all the input stages allocated to the detectors of the said bar.

The limits of the channels carrying the charges coming from each detector are set by utilising, for example, vertical insulating diffusions denoted by d in FIG. 3.

The second grid 62 is followed by a series of third grids 63 $(i-1)$, $63(i)$, $63(i+1)$ which are insulated from each other by the insulating diffusions d. Each of these grids is connected via contact elements $8(i-1)$, $8(i)$, $8(i+1)$ to the outputs of a shift register having parallel outputs like those of FIGS. 1 and 2. This shift register may comprise MOS transistors. It may also be a charge transfer shift register. This register may be integrated without any difficulty in the second semiconductor substrate.

After the third grids a diode $7(i-1)$, $7(i)$, $7(i+1)$ is encountered in each channel.

A connection 11 is in direct contact with these diodes by means of openings 9 formed in the insulating layer 5 which covers the second semiconductor substrate. The connection 11 is joined to the common readout means of the bar as a whole and of which an embodiment is illustrated as seen from above, in FIG. 4. The connection 11, for example of aluminum, is connected to a diode 18 integrated in the second semiconductor substrate 1.

In the embodiment of FIG. 4, the readout means comprise two grids 12 and 13 kept at constant potentials. The level of the charges under the diodes... $7(i-1)$, $7(i)$, $7(i+1)$... and under the diode 18 is aligned on the surface potential present under the grid 12, as is apparent from FIGS. 5b, c and d. The two grids 12 and 13 are followed by an MOS transistor integrated on the second semiconductor substrate and formed by a grid 15 and by two diodes 19 and 20 in contact via openings 9 formed in the insulating layer 5 covering the substrate 1 with two connections 14 and 16. A follower stage 17 is coupled to the connection 14. In FIG. 4, this stage is illustrated diagrammatically by an MOS transistor in series with a resistor R which is equally connected to ground. The output S of the device is tapped off the connection between this MOS transistor and the resistor. As a matter of fact, this MOS transistor may be integrated in the second semiconductor substrate as well as the resistor R which may be formed by another MOS transistor.

FIG. 5a is a view in cross-section taken through the device of FIGS. 3 and 4 along the lines AA' and BB'. FIGS. 5b, c and d show the changes in surface potential in the substrate at different instants $t_1$, $t_2$, $t_3$.

The signals $V_{8(i-1)}$, $V_{8(i)}$, $V_{8(i+1)}$ collected at the outputs of the shift register connected to the contacts $8(i-1)$, $8(i)$, $8(i+1)$ have been illustrated in FIGS. 6a, b and c. These signals pass to the high level consecutively. In FIG. 6d is illusrated the zero reset signal $\phi_R$ applied to the grid 15 of the transistor which terminates the readout stage. The output signal S of the device, obtained at the output of the follower stage coupled to the connection 14 has been illustrated in FIG. 6e.

At the instant $t_1$, the signal $V_{8(i)}$ is at a low level—see FIG. 5b. The grid 63(i) prevents the charges coming from the detector $D_{11}$ from passing towards the connection 11. These charges are accumulated in the capacitance formed by the grid 62.

At the time $t_2$—see FIG. 5c—the signal $V_{8(i)}$ is at a high level and the charges derived from the detector $D_1$ flow through the connection 11 to just below the capacitance formed by the grid 13 and the diode 19. The grid 13 may be omitted. The level of the charges under the diodes 19, of which the potential is allowed to float, is read out by means of the voltage follower 17 coupled to the connection 14. In FIG. 6e has been illustrated the signal obtained at the output S of the voltage follower stage.

The other grids $63(i-2)$, $63(i-1)$, $63(i+1)$, $63(i+2)$ are at the low level and do not permit passage of the charges towards the connection 11.

At the time $t_3$—see FIG. 5d—the signal $V_{8i}$ is at the low level again. The charges derived from the detector $D_1$ are stored under the grid 62, whereas the change to the high level of the signal $\phi_R$ fed to the grid 15 assures the grid 13 being reset to its level as is the diode 19. The surface potential under the diode 19 and the grid 15 is levelled at the surface potential under the diode 20.

After readout of the detector $D_1$, the change to the high level of the signal $V_{8(i+1)}$ causes the readout of the following detector.

In the embodiment of FIGS. 3, 4, 5, the means enabling the injection of the charges into the second semiconductor substrate comprise a diode to which the photodetector is connected. It is quite evident that these injection means may be formed by a grid connected to the photodetector, this grid being preceded by a diode which provides a quantity of charges controlled by means of the grid connected to the photodetector.

Analogously, the infra-red detectors may for example be photodiodes or for example detectors of the grid—insulator—semiconductor type.

According to a modification of the device illustrated in FIGS. 3, 4 and 5, the grid 62 under which are stored the charges may be formed by elementary grids $62(i-1)$, $62(i)$, $62(i+1)$ . . . addressed by the shift register, whereas the grids $63(i-1)$, $63(i)$, $63(i+1)$ may be replaced by a single grid 63 at a constant potential. In this case, the transfer of the charges stored under one of the grids 62 towards the connection 11 occurs over the top of the grid 63 by modifying the biasing of one of the storage grids 62.

Regarding the readout means, the embodiment of FIGS. 3, 4, 5 permits placing the device as a whole in a cryostat having a single output S at high level. The detectors and the remainder of the device are then integrated on two different and satisfactorily appropriate semiconductor substrates. For example, consisting of indium antimonide, tin and lead telluride, cadmium and mercury telluride . . . , in the case of the photodetectors. The remainder of the device is integrated on a silicon semiconductor substrate, for example of the P or N type.

In the embodiment of FIGS. 3, 4 and 5, the voltage follower stage 17 may be replaced by an operational amplifier arranged as an integrator and connected to the floating diode 19 under which are successively directed the charges derived from each detector of the said bar. This amplifier is commonly external to the cryostat, since its temperature is rather high, and because it is impossible to integrate the same on the second semiconductor substrate.

FIGS. 7 and 8a, b, c, d relate to an embodiment of the device according to the invention, in which the detectors are distributed in the form of a two-dimensional mosaic.

FIG. 7 is a view from above of a part of this device. FIG. 8 is a view in cross-section along the broken line CC' of FIG. 7, and FIGS. 8b, c and d show the chronological change of the surface potential in the semiconductor substrate.

The detectors are not illustrated in FIG. 7. The device of FIG. 7 is associated with a mosaic comprising four lines of two detectors each. Each detector is coupled by a connection $4(i,j)$, $4(i+1,j)$ . . . to a diode 2 integrated in the second semiconductor substrate 1 via an opening 3 formed in the oxide layer 5 covering the substrate. The vertical grids 61 and 62 which are common to all the charge injection diodes 2 of one and the same column play the same part as the horizontal grids 61 and 62 of FIG. 3. The vertical grids $63(i)$ and $63(i+1)$ play the same part as the horizontal grids $63(i-1)$, $63(i)$, $63(i+1)$ . . . of FIG. 4. Connections $8(i)$, $8(i+1)$ . . . join each of these grids to the outputs of a shift register. Each column of detectors is addressed successively in this manner. The vertical grids 64 placed at a constant potential act as screening electrodes.

Between the grids 64 are encountered four diodes $7(j-1)$, $7(j)$, $7(j+1)$, $7(j+2)$ under which are successively fed the charges originating from the right-hand or left-hand column of diodes 2. This makes it possible to reduce the bulk of the device or, for example, to increase the storage capacities. Connections $11(j-1)$, $11(j)$, $11(j+1)$, $11(j+2)$ couple the diodes $7(j-1)$, $7(j)$ . . . associated with the detectors of one and the same line to readout means which are common to the detectors of one and the same line. These readout means are consequently utilised for consecutively reading the storage means of the detectors of one and the same line. In FIGS. 7 and 8, these readout means comprise a diode 18 coupled via an opening passing through the insulator to one of the connections $11(j-1)$, $11(j)$, $11(j+1)$ . . . . Following the diodes 18 are encountered three vertical grids 71, 72, 73 common to all the diodes 18. The grid 71 is at a constant potential and acts as screening. The grids 72 and 73 have the same function as the grids 12 and 13 of FIG. 5a.

The grid 73 controls access to a vertical charge transfer shift register illustrated in FIG. 7 by a series of grids 74a, b, c, d. A charge current or voltage reading device is associated with this register and provides the output S of the device.

FIGS. 8b, c and d show the change of the surface potential in the second semiconductor substrate at different instants.

In FIG. 8b, the charges derived from the detectors $D_{12}$ and $D_{22}$ are stored in the capacitances formed by the grids 62.

In FIG. 8c, the shift register addresses the grid 63(i) and the charges derived from the detector $D_{12}$ and from the other detectors of the same column are transferred towards the diodes ... 7(j−1), 7(j), 7(j+1) ... and, via connections 11(j), 11(j+1) ... under the capacities present below the grid 72. In FIG. 8d, the charges derived from the detectors of column i are transferred in parallel into the charge transfer register, whilst the storage of the charges derived from the detectors of this column into the capacitances attributable to the grids has resumed. Each column of detectors is thus read sequentially by the charge transfer register. In this embodiment, the device as a whole may be placed within a cryostat comprising only one high-level output. In the case of a mosaic of detectors, or matrix of detectors, use may be made of the readout means described for the said bars, for example a voltage follower stage or operational amplifiers arranged as an integrator, the outputs of all these followers or amplifiers then having to be multiplexed.

In the different embodiments of the invention which have been described, use may be made of horizontal grids instead of vertical grids, and conversely.

What is claimed is:

1. A device photosensitive to infra-red radiation, comprising at least one line of several infra-red detectors integrated on a first semiconductor substrate, placed within a cryostat, each detector being connected to means for injecting a quantity of charge as a function of the infra-red radiation received by each detector into a second semiconductor substrate situated within the crysostat, this device comprising means associated with each detector for assuring the storage of the charges in the second substrate and further comprising charge readout means, wherein each injecting means being connected to a first grid kept at a constant potential and being connected to a second grid under said second grid are stored charges coming from a detector, the second grid being connected to a third grid connected to an output of a shift register having parallel outputs, said register successively addressing said third grid associated to each detector of a same line, said third grid controlling access to a diode connected to another diode in the read out means which are common to the detectors of a same line and performing sequential readout of the detectors in said same line.

2. A device as claimed in claim 1, wherein the readout means comprise a follower stage connected to a floating diode to which are successively transmitted the charges coming from each detector of one and the same line, these readout means being integrated on the second semiconductor substrate.

3. A device as claimed in claim 1, wherein the readout means comprise an operational amplifier arranged as an integrator external to the cryostat, connected to a floating diode, integrated in the second substrate, to which are successively transmitted the charges derived from each detector of one and the same line.

4. A device as claimed in claim 1, which comprises several lines of detectors wherein the readout means integrated in the second semiconductor substrate are formed by a charge transfer shift register having parallel inputs and a series output which at its inputs simultaneously receives the charges derived from the detectors of different lines and of one and the same column, this register being connected to a charge reading device.

5. A device as claimed in claim 1, wherein the said detectors are photodiodes.

6. A device as claimed in claim 5, wherein the anodes of the said photodiodes are grounded and the cathode of the said photodiodes is connected to a diode or to a grid integrated in the second semiconductor substrate.

7. A device as claimed in claim 1, which comprises several lines of detectors and wherein the diodes terminating the storage means are common to two adjacent storage means.

8. A device as claimed in claim 1, wherein the material of the second semiconductor substrate is silicon.

9. A device as claimed in claim 1, comprising several lines and several columns of detectors, wherein each of said parallel outputs of the shift register successively addresses a third grid associated with the detectors of a same column.

10. A device as claimed in claim 4 which comprises several lines of detectors and wherein the diodes terminating the storage means are common to two adjacent storage means.

11. A device according to claim 4 comprising several lines and several columns of detectors, wherein each of said parallel outputs of the shift register successively addresses a third grid associated with the detectors of a same column.

12. A device according to claim 7 comprising several lines and several columns of detectors, wherein each of said parallel outputs of the shift register successively addresses a third grid associated with the detectors of a same column.

13. A device according to claim 10 comprising several lines and several columns of detectors, wherein each of said parallel outputs of the shift register successively addresses a third grid associated with the detectors of a same column.

* * * * *